United States Patent
Guenther et al.

(10) Patent No.: US 7,262,441 B2
(45) Date of Patent: Aug. 28, 2007

(54) LAMINATES FOR ENCAPSULATING DEVICES

(75) Inventors: Ewald Karl Michael Guenther, Singapore (SG); Wei Wang, Singapore (SG); Soo Jin Chua, Singapore (SG)

(73) Assignees: Osram Opto Semiconductors GmbH & Co. OHG, Regensburg (DE); Institute of Materials Research and Engineering, Singapore (SG)

( * ) Notice: Subject to any disclaimer, the term of this patent is extended or adjusted under 35 U.S.C. 154(b) by 0 days.

(21) Appl. No.: 11/171,826

(22) Filed: Jun. 29, 2005

(65) Prior Publication Data

US 2005/0236640 A1    Oct. 27, 2005

Related U.S. Application Data

(63) Continuation of application No. 09/786,833, filed as application No. PCT/SG99/00070 on Jul. 9, 1999, now Pat. No. 6,949,825.

(51) Int. Cl.
*H01L 29/21* (2006.01)
(52) U.S. Cl. .................... 257/100; 257/414
(58) Field of Classification Search ........ 257/684–690, 257/700–705, 723–730; 313/438–510
See application file for complete search history.

(56) References Cited

U.S. PATENT DOCUMENTS

| | | | |
|---|---|---|---|
| 4,287,285 A | 9/1981 | Mosehauer | |
| 4,501,637 A | 2/1985 | Mitchell et al. | |
| 4,720,432 A | 1/1988 | Van Slyke et al. | |
| 4,746,392 A | 5/1988 | Hoppe | |
| 4,767,679 A | 8/1988 | Kawachi | |
| 5,022,554 A | 6/1991 | Heeter et al. | |
| 5,276,381 A | 1/1994 | Wakimoto et al. | |
| 5,408,109 A | 4/1995 | Heeger et al. | |
| 5,693,956 A | 12/1997 | Shi et al. | |
| 5,742,129 A | 4/1998 | Nagayama et al. | |
| 5,781,169 A | 7/1998 | Kujik et al. | |
| 5,804,917 A | 9/1998 | Takahashi et al. | |
| 5,844,363 A | 12/1998 | Gu et al. | |
| 5,920,080 A | 7/1999 | Jones | |
| 6,069,443 A | 5/2000 | Jones et al. | |
| 6,175,186 B1 | 1/2001 | Matsuura et al. | |
| 6,198,217 B1 | 3/2001 | Suzuki et al. | |
| 6,268,695 B1 | 7/2001 | Affinito | |
| 6,278,237 B1 | 8/2001 | Campos | |
| 6,309,901 B1 * | 10/2001 | Tahon et al. ........... | 438/29 |

(Continued)

FOREIGN PATENT DOCUMENTS

FR    2585510    1/1987

(Continued)

OTHER PUBLICATIONS

Burroughs, J.H. et al., "Light-emitting diodes bases on conjugated polymers", Nature vol. 347, Oct. 11, 1990, 539.

(Continued)

*Primary Examiner*—Leonardo Andújar
(74) *Attorney, Agent, or Firm*—Fish & Richardson P.C.

(57) ABSTRACT

An encapsulation for an electrical device is disclosed. The encapsulation comprises plastic substrates which are laminated onto the surface of the electrical device. The use of laminated plastics is particularly useful for flexible electrical devices such as organic LEDs.

23 Claims, 5 Drawing Sheets

U.S. PATENT DOCUMENTS

| | | |
|---|---|---|
| 6,592,969 B1 | 7/2003 | Burroughes et al. |
| 6,600,175 B1 | 7/2003 | Baretz et al. |
| 6,949,825 B1 | 9/2005 | Guenther et al. |

FOREIGN PATENT DOCUMENTS

| | | |
|---|---|---|
| GB | 2028719 | 3/1980 |
| JP | 58-39075 | 3/1983 |
| TW | 155504 | 4/1991 |
| TW | 449938 | 8/2001 |
| WO | WO01/04938 A1 | 1/2001 |
| WO | WO01/04963 | 1/2001 |

OTHER PUBLICATIONS

Harper, Charles A., "Electronics Packaging and Interconnection Handbook", © 1991, McGraw-Hill, Inc., pp. 1.22-1.23, 1.40-1.42.

* cited by examiner

LAMINATES FOR ENCAPSULATING DEVICES

CROSS-REFERENCE TO RELATED APPLICATIONS

This application is a continuation application and claims the benefit of priority under 35 U.S.C. Section 120 of U.S. application Ser. No. 09/786,833, filed on Jun. 18, 2001 now U.S. Pat. No. 6,949,825, which claims priority to International Application Serial No. PCT/SG99/00070, filed Jul. 9, 1999. The disclosure of the prior applications is considered part of and is incorporated by reference in the disclosure of this application.

FIELD OF THE INVENTION

The present invention relates to the fabrication of devices. More particularly, the invention relates to packaging of devices.

BACKGROUND

In device fabrication, one or more device layers are formed on a substrate. The layers are sequentially deposited and patterned to create features on the surface of the substrate. The layers can be patterned individually and/or as a combination of layers to form the desired features. The features serve as components that perform the desired functions, creating the device.

One type of device which is of particular interest is a light emitting diode (LED). LEDs can have a variety of applications. For example, a plurality of LED cells or pixels can be formed on a substrate to create a pixelated LED device for use as a display, such as a flat panel display (FPD) for telephones, computer displays, TV screens and the like.

Typically, an LED pixel comprises one or more functional layers sandwiched between two electrodes to form a functional stack. Charge carriers are injected from both electrodes. These charge carriers recombine in the functional layer or layers, causing visible radiation to emit. Recently, significant advances have been made utilizing organic functional layers to form organic light emitting diodes (OLEDs).

OLED pixels are very sensitive to the environment. Exposure to moisture and/or air causes rapid degradation of the OLED, creating reliability problems. Some of the substances used to build the layers are sensitive organic compounds and some reactive metals like Calcium and Magnesium. These materials are extremely susceptible to damage caused by oxidation in the presence of oxygen and/or moisture. Thus, a package which adequately protects the OLED from the environment is needed. Further, the package should be cost effective and conducive to high throughput to reduce the overall manufacturing cost and time.

SUMMARY OF THE INVENTION

The invention relates to packaging of a device. In accordance with the invention, the device is package using a laminate. In one embodiment, laminates are placed on the top and bottom of a device. The laminates are pressed against the device and heated to activate a sealant which causes the laminates to adhere to the device. In one embodiment, the laminate is pressed against the device and heated using rollers.

PREFERRED EMBODIMENTS OF THE INVENTION

The invention relates generally to the fabrication of devices. In particular, the invention provides a cost effective package for encapsulating devices, particularly those formed on flexible or thin substrates.

Figure 1:
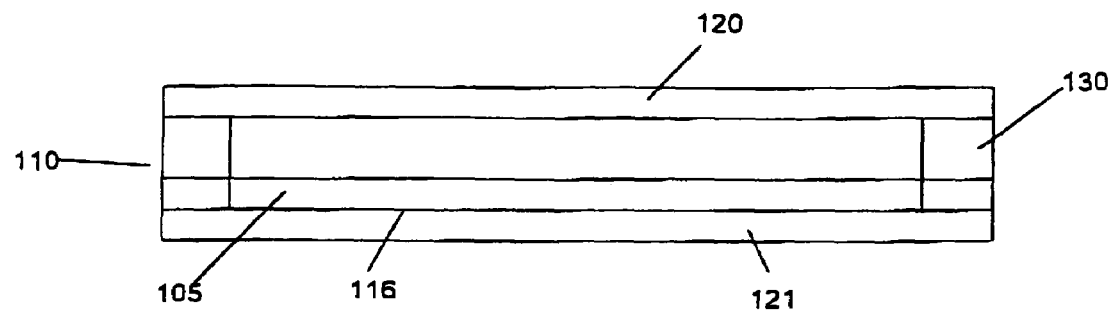
FIG. 1 shows an embodiment of the invention.

FIG. 1 shows a cross section of a device 110 in accordance with one embodiment of the invention. The device can be, for example, electrical, mechanical, or electromechanical. Microelectromechanical systems (MEMS) are also useful. The device comprises one or more active components formed on a substrate. The active components provide the desired electrical and/or mechanical functions.

To reduce the overall thickness of the device, the active components can be formed on a thin substrate, such as less than 0.3 mm thick. Forming the active components on a thin flexible substrate is also useful to provide a flexible device. The substrate comprises, for example, plastic, polymer, silicon, ceramic, glass, or quartz glass. Other types of substrates, such as semiconductor substrates are also useful. The thin substrate should provide adequate mechanical integrity to support the components during and after processing. Typically, the thin substrates are about 20-300 um.

In one embodiment, the device 101 comprises an electrical device, such as a pixelated OLED device. Terminals or pins (not shown) which enable electrical connections to the active components are provided. OLED devices are described in, for example, U.S. Pat. No. 4,720,432 and Burroughes et. al, Nature 347(1990) 539, which are herein incorporated by reference for all purposes. The pixels of the OLED device can be arranged to form an FPD. FPDs are used in various consumer electronic products, including cellular phones, cellular smart phones, personal organizers, pagers, advertising panel, touch screen displays, teleconferencing equipment, multimedia equipment, virtual reality products, and display kiosks. In one embodiment, the organic LED device comprises a flexible substrate to provide bending, creating, for example, a flexible FPD.

The OLED pixels are materials formed on a substrate 105. In one embodiment, the substrate comprises a transparent substrate and serves as the display surface. The substrate is prepared to support a laminate 120. For example, supports 150 are provided surrounding the OLEDs to support the laminate. The laminate covers the device and hermetically seals the components, protecting them from the environment. The device can also include support posts (not shown) in the non-active regions to provide support for the laminate. This prevents the laminate from collapsing onto the components and affecting the device's functionality. Support posts are particularly useful for flexible devices. Providing support posts in non-active regions of the device is described in concurrently filed International Patent Application titled "Encapsulation of a Device", PCT International Publication Number WO 01/04963 A1, published Jan. 18, 2001, which was filed as U.S. application Ser. No. 09/787,400, and issued as U.S. Pat. No. 6,888,237, which is herein incorporated by reference.

The support posts can be formed from a dielectric material to electrically isolate the active regions. The material can be directly or indirectly patternable material. The directly patternable material can be photopatternable or photosensitive material. Photopatternable materials include, for example, photosensitive polyimide, photosensitive polybenzoxazole, photoresists, photoresists based on novalac systems, and dry film resist materials. Photoresists based on novalac systems are particularly useful since they can be cured and crosslinked to provide improved mechanical integrity over other types of non-curable resists. Indirectly patternable materials, include, for example, spin-on glass materials, polyimide, polybenzoxazole, polygultarimide, benzocyclobutene, polymers such as polyethylene (PE), polystyrene (PSO), polypropylene (PP), or inorganic materials such as silicon dioxiode, silicon nitride, and aluminum oxide.

A spacer layer can be deposited on the surface of the substrate 105 to form the cap supports 130. The spacer layer can comprise a multi-layer architecture. For multi-layer spacer architectures, the lower portion comprises dielectric characteristics for isolating the anode electrodes of the LED pixels. If isolation is not necessary, the lower portion need not comprise dielectric characteristics. The upper portion can comprise various materials such as a metal. The use of a multi-layer spacer architecture can be advantageous since the upper portion can be selected to comprise a material that enhances sealing with a cap or encapsulation layer. For example, metals like Al, W, Ni, Cr, Co, Ag, Pt are useful as they facilitate good adhesion with a metallic cap. Polymers, such as PE, PP, PS, can be used to form the upper portion to provide good adhesion facilitate with a polymeric, a glass, or a metallic cap. The upper and lower portions can include one or more layers. The total thickness of the layers is equal to about the desired height of the support posts.

The OLED pixels are materials formed on a substrate 105. In one embodiment, the substrate comprises a transparent substrate and serves as the display surface. The substrate is prepared to support a laminate 120. For example, supports 130 are provided surrounding the OLEDs to support the laminate. The laminate covers the device and hermetically seals the components, protecting them from the environment. The device can also include support posts (shown in FIG. 6) in the non-active regions to provide support for the laminate. This prevents the laminate from collapsing onto the components and affecting the device's functionality. Support posts are particularly useful for flexible devices. Providing support posts in non-active regions the device is described in co-currently filed International Patent Application titled "Encapsulation of a Device", the '963 publication described supra, which is herein incorporated by reference for all purposes.

Figure 6:
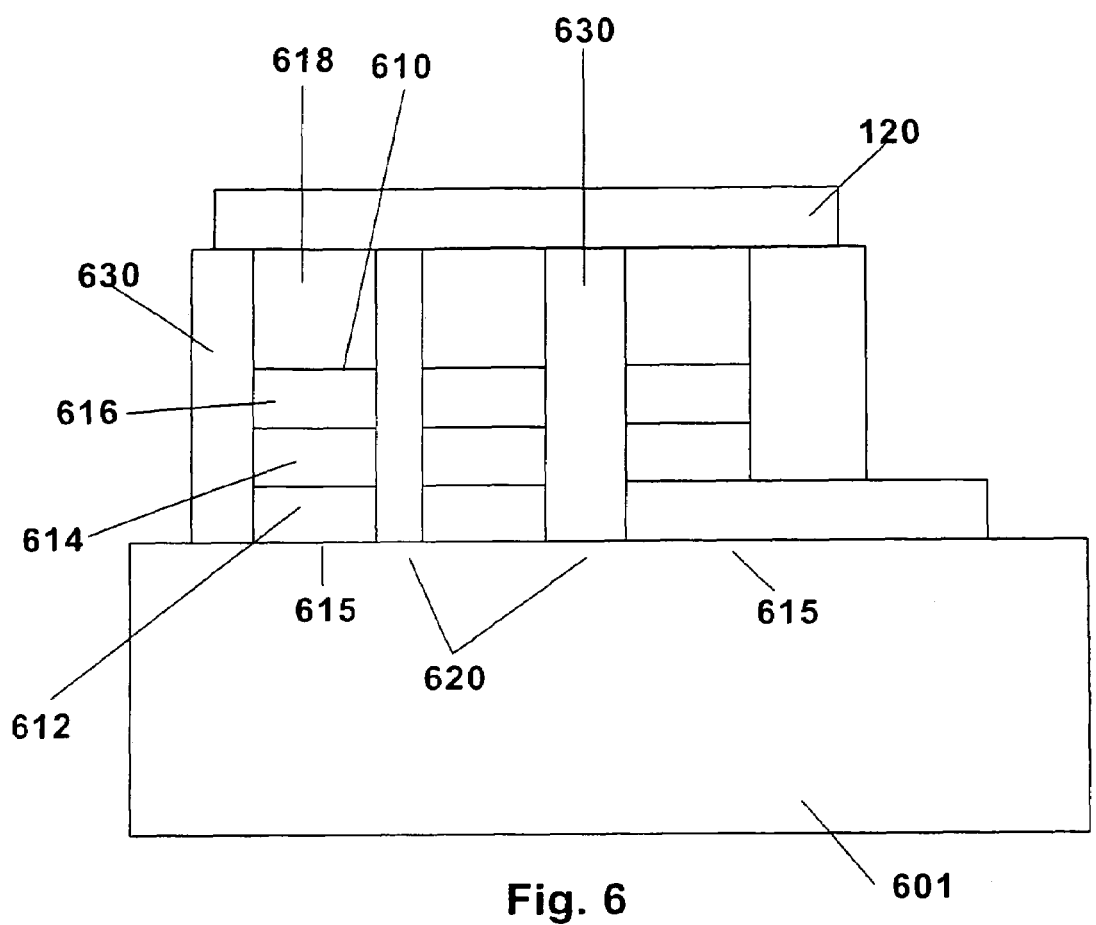
FIG. 6 shows an embodiment that includes support posts.

One embodiment of a device with support posts is shown in FIG. 6. Active components 610 include organic LED pixels. An organic LED pixel comprises at least one organic layer 614 between first and second electrodes 612 and 616. The active components 610 are located on active regions 615 of the substrate 601 and are separated by non-active regions 620. Support posts 630 are located in the non-active regions 620 of the substrate 601 and in the periphery of the device surrounding the active regions 615. The support posts 630 can be provided in one, some, or in all the non-active regions 620. A cap 120, which in this embodiment is a laminate, is mounted on the support posts 630 to encapsulate the device in order to protect the active components from air and/or moisture. The height of the support posts 630 creates a gap or cavity 618 between the surface of the LED pixels and cap 120. The gap should be sufficient to prevent the cap from contacting the LED pixels. Typically, the gap is about 1-10 microns in height. Of course, the gap height can vary due to the amount of stress induced (e.g., amount of bending required from the device, thickness of the cover layer, and lateral distance between support posts).

A second laminate 121 can be provided to cover the opposite side 116 of the device. As shown, the opposite side comprises the bottom surface of the substrate. The second laminate seals the substrate, preventing the diffusion of air and/or moisture. The laminate can also protect the organic display surface from, for example, scratches. To provide visibility to the display, a transparent laminate is used.

In one embodiment, the laminate comprises a flexible material. The flexible laminate is particularly useful with flexible devices, such as those formed on a flexible substrate. Depending on the optical requirements, a transparent or opaque laminate can be used. For example, the display side of the organic OLED device is encapsulated with a transparent laminate. As for the non-display side, the optical characteristics of the laminate is not important.

A sealant is used to attach the laminate on the device, sealing the components to protect them from moisture and air. The sealant, in one embodiment, can flow at a given temperature (activation temperature) to ensure complete sealing of the device. The activation temperature of the sealant should be sufficiently low enough to avoid damaging the components of the device.

Figure 2:
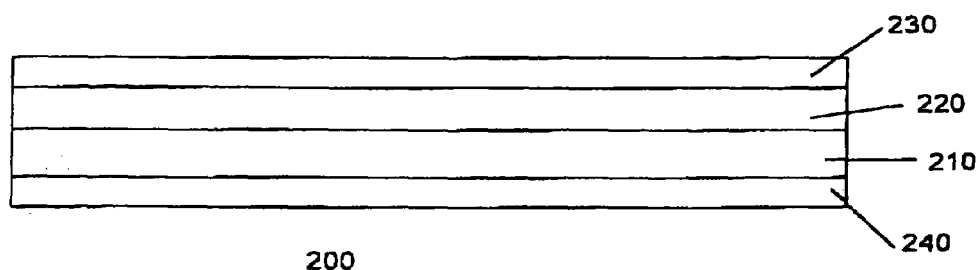
FIG. 2 shows a laminate for encapsulating an electrical device in accordance with one embodiment of the invention.

FIG. 2 shows a laminate 200 for encapsulating the device in accordance with one embodiment of the invention. As shown, the stack comprises a laminate substrate 210. The laminate substrate preferably comprises a material with sufficient thermal stability to maintain its mechanical integrity during the adhesion process. The thickness of the laminate substrate depends on the substrate material. Typically, the laminate substrate is about 10-400 μm thick. The thickness of the laminate substrate should be as thin as possible to reduce the overall device thickness.

In one embodiment, the substrate comprises a flexible material, such as a plastic film. Various commercially available plastic films are useful. Such films, for example, include transparent poly(ethylene terephthalate) (PET), poly(butylene terephthalate) (PBT), poly(enthylene naphthalate) (PEN), Polycarbonate (PC), polyimides (PI), polysulfones (PSO), and poly(pphenylene ether sulfone) (PES). Other films such as polyethylene (PE), polypropylene (PP), poly (vinyl chloride) (PVC), polystyrene (PS) and poly(methyl methyleacrylate) (PMMA) can also be useful.

A barrier layer 220 is formed on the surface of the substrate to prevent the diffusion of oxygen and/or moisture, thereby protecting the device. The use of the barrier layer can be avoided if the substrate material can prevent the diffusion of oxygen and/or moisture. Preferably, the barrier is formed on the inner surface (surface facing the device) of the laminate. As such, the substrate protects the barrier layer from damage. The thickness of the barrier should be sufficient to prevent diffusion of oxygen and/or moisture. For flexible applications, the barrier layer should be as thin as possible so as not to hinder the flexibility of the device. Typically, the thickness of the barrier layer is about 5-5000 nm. In one embodiment, barrier layers are coated on both sides for more efficient protection.

In one embodiment, the barrier layer comprises a metallic film such as copper or aluminum. Other materials which can serve as an oxygen and/or moisture barrier, such as ceramic, are also useful. A barrier comprising multiple of different barrier material layers is also useful. The metallic barrier layer can be coated on the substrate by various deposition techniques such as thermal evaporation, sputtering, chemical vapor deposition (CVD), or plasma enhanced CVD (PECVD). Alternatively, the barrier film can be glued or laminated directly to the substrate surface. For transparent applications, the barrier layer can comprise a dielectric material such as silicon monoxide (SiO), silicon oxide ($SiO_x$), silicon dioxide ($SiO_2$), silicon nitride ($Si_xN_y$), or metal oxide such as aluminum oxide ($Al_2O_3$). Other dielectric materials which prevent the diffusion of oxygen and/or moisture are also useful to serve as a barrier layer. The dielectric barrier layer can be formed on the substrate by various deposition techniques such as thermal oxidation, CVD, or PECVD.

A sealant or adhesive layer 230 is provided above the barrier layer. The sealant layer provides adhesion to the surface of the electrical device when compressed under heated conditions. Preferably, the sealant should be activated at an elevated temperature, causing the laminate to adhere to the surface of the device and sealing the components. To ensure good sealing between the laminate and the device, the sealant should flow slightly at the activation temperature. The activation temperature should be below that which damages the device, such as altering the chemistry and/or physics of the active components. Preferably, the activation temperature of the sealant is as low as possible. For example, the activation temperature is about 80-140° C.

In one embodiment, the sealant is a hot melt type adhesive. Polymer mixtures which can include different polymers and/or additives are also useful. Preferably, the sealant comprises ethylene vinyl acetate resins, ethylene ethyl acrylate resins. Other types of sealant, such as low-density polyethylene, copolymers including ethylene-vinyl acetate resins, ethylene-ethyl acrylate resins are also useful. The sealant can be coated on the surface of the laminate using conventional techniques.

Optionally, a protective layer 240 can be formed on the outer surface of the laminate. The protective layer comprises, for example, polymeric resin that serves as a hard coating that protects the substrate from being scratched. Alternatively, an adhesive layer can be formed on the outer surface of the substrate for further processing, such as adhering additional layers thereon. These additional layers can include, for example, color filters, polarizers, or anti-glare films.

Figure 3:
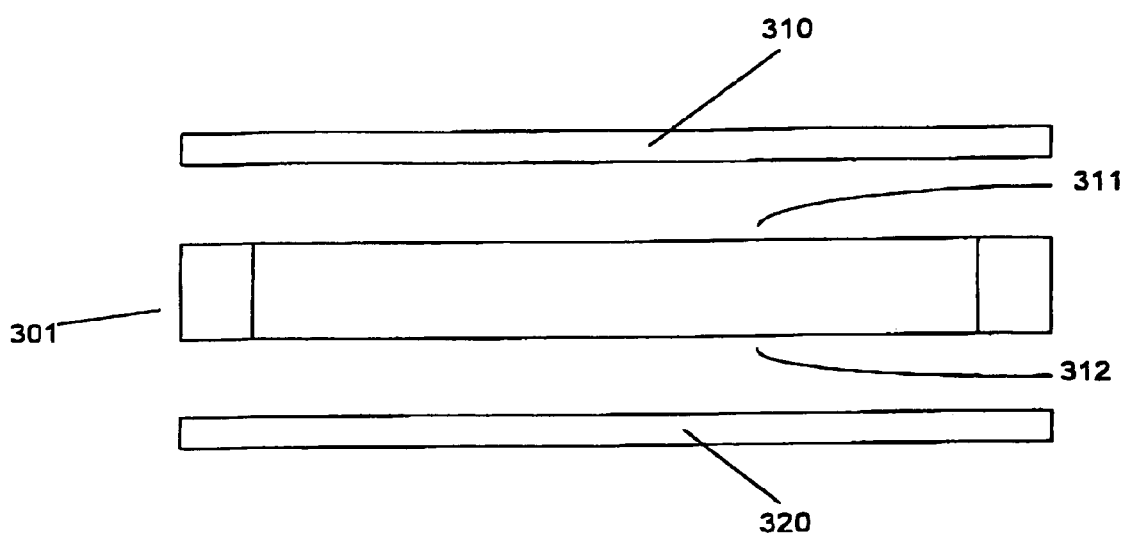
FIGS. 3-5 illustrate a process for encapsulating an electrical device.
Figure 4:
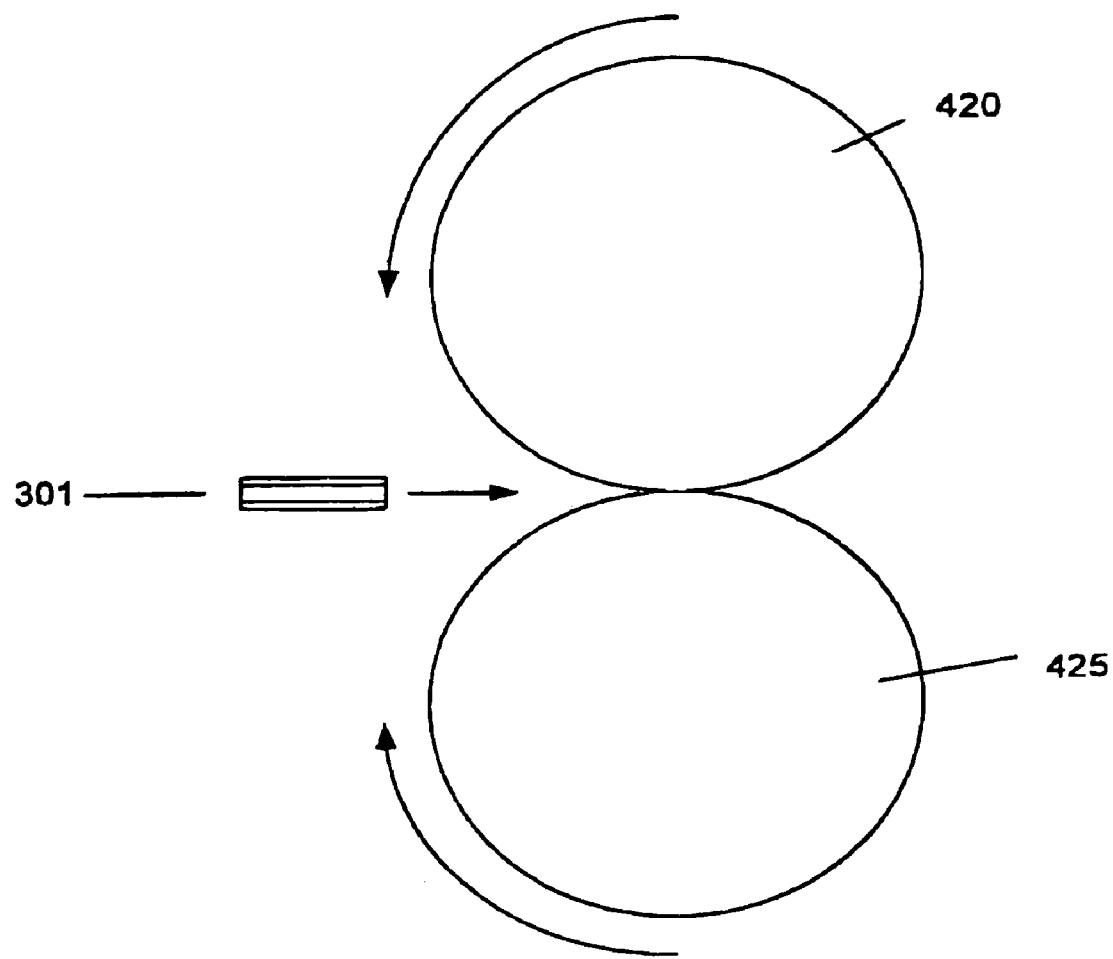
Figure 5:
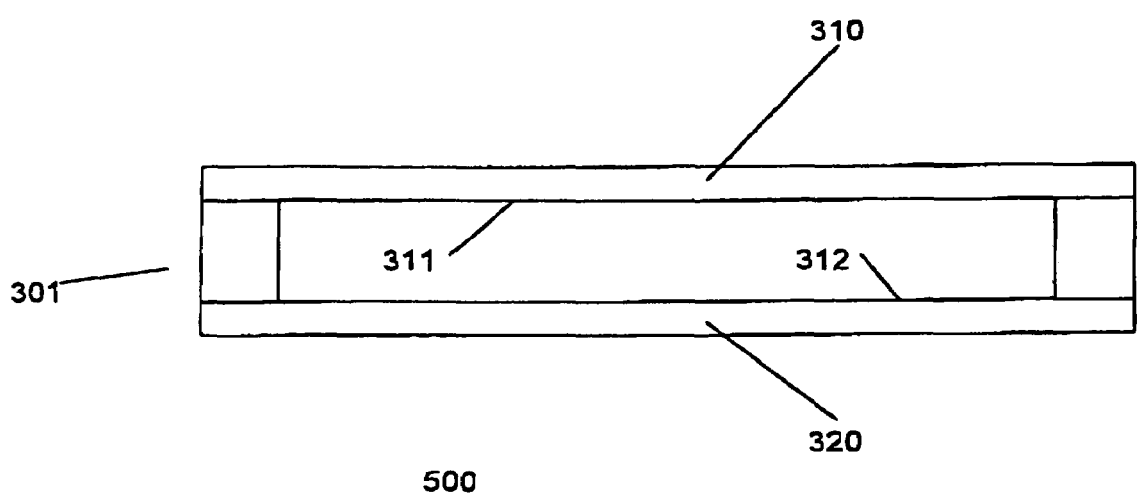

FIGS. 3-5 show a process for encapsulating a device in accordance with one embodiment of the invention. Referring to FIG. 3, a device 301 is shown. The device, for example, comprises a pixelated OLED device. Other electrical devices, such as sensor arrays or MEMS, are also useful. Preferably, the device is formed on a flexible or thin substrate.

A first laminate 310 is placed over the device to cover the active components. If necessary, a second laminate 320 is placed on the bottom surface of the device. Depending on the optical requirements, the laminates can be transparent or opaque. For example, a transparent laminate is used on the display surface of the OLED device. The inner surface of the laminates comprises a sealant for sealing the laminate to the surfaces of the device.

Referring to FIG. 4, a laminating tool 401 is provided. The laminating tool, for example, comprises first and second rollers 420 and 425. The rollers can be made of rubber. Other materials such as silicon can also be used. During operation, the rollers are heated and rotated. The rollers rotate in opposite directions, as indicated by the arrows, to pull the device 301 with the laminates thereon through the rollers.

As the device is pulled through the rollers, the laminates are heated and compressed onto the surfaces of the device. The pressure exerted by the rollers should be sufficient to facilitate sealing without crushing or damaging the device. Typically, the pressure exerted by the rollers is about 1-500 $kN/m^2$. The laminates are heated to a temperature above the activation temperature of the sealant. The process temperature should be maintained as low as possible, for example, slightly above the sealant's activation temperature. The speed of the rollers can be adjusted to ensure complete sealing of the laminates onto the devices.

Referring to FIG. 5, after the device is pulled through the rollers, the encapsulation process is completed to form the device 500 as shown. The present invention, as described, performs encapsulation of the device in an environment free of any evaporable chemicals. This is advantageous as the possibility of corrosion of the active components from chemicals are avoided, thereby improving yields. Further, the encapsulation process can be modified to provide continuous and parallel processing to increase throughput and decrease raw process time. For example, large laminates can be used to sandwich a plurality of devices therebetween. The laminates than are processed through the rollers, encapsulating a plurality of devices. The devices can then be separated after encapsulation.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
   a substrate;
   at least two active components formed on a top surface of the substrate;
   at least one non-active region separating the active components;
   a first laminate comprising a plastic and a sealant layer over the top surface of the substrate, encapsulating the at least two active components; and
   at least one support post in the at least one non-active region, providing support for the first laminate;
   wherein the at least one support post includes a multi-layer architecture, having at least a first layer and a second layer, the first layer is adjacent to the active components, the second layer contacts the sealant layer of the first laminate arid the first layer contacts the second layer.

2. The device of claim 1 wherein:
   the first layer includes a dielectric material for isolating the active components; and
   the second layer includes a material that enhances sealing with the first laminate.

3. The device of claim 1, wherein the sealant layer includes one of an ethylene vinyl acetate resin, a low-density polyethylene, an ethylene-ethyl acrylate resin.

4. The device of claim 1, wherein:
   the first layer includes a dielectric material to electrically isolate the active components; and
   the second layer includes a material that enhances sealing with the first laminate.

5. The device of claim 4, wherein the sealant layer includes one of a low-density polyethylene, an ethylene-vinyl acetate resin or an ethylene-ethyl acrylate resin.

6. The device of claim 1, wherein the first layer includes a directly patternable material.

7. The device of claim 6, wherein the directly patteniable material includes one of photosensitive polyimide, photosensitive polybenzoxazole, a photoresist, a photoresist based on a novalac system or a dry film resist material.

8. The device of claim 1, wherein the first layer includes an indirectly patternable material.

9. The device of claim 8, wherein the indirectly patternable material includes one of a spin-on glass, polyimide, polybenzoxazole, polyglutarimide, benzocyclobutene, polyethylene (PE), polystyrene (PSO), polypropylene (PP), silicon dioxide, silicon nitride or aluminum oxide.

10. The device of claim 1, wherein the at least two active components comprise organic light emitting diode devices.

11. The device of claim 1, wherein the substrate comprises a flexible substrate.

12. The device of claim 11, wherein the substrate comprises a substrate material selected from the group of materials consisting of polymer, glass, ceramic, and semiconductor material.

13. The device of claim 11, wherein the substrate comprises a transparent substrate.

14. The device of claim 1 wherein the substrate supports the active components.

15. The device of claim 1 wherein the substrate includes a material selected from a polymer or glass.

16. The device of claim 1, wherein a second laminate seals the substrate.

17. The device of claim 1, wherein the second layer makes a direct seal with the first laminate.

18. The device of claim 1, wherein the second layer includes one of aluminum, tungsten, nickel, chromium, cobalt, silver, platinum, polyethylene, polypropylene or polystyrene.

19. A device comprising:
a substrate;
at least two active components formed on a top surface of the substrate;
at least one non-active region separating the active components;
a laminate comprising a plastic over the top surface cf the substrate, encapsulating the at least two active components; and
at least one support post in the at least one non-active region, providing support for the laminate; wherein
the at least one support post includes a multi-layer architecture, having at least a first layer and a second layer, the first layer is adjacent to the active components and the second layer is adjacent to the laminate;
the first layer includes a dielectric material for isolating the active components; and
the second layer includes one of a low-density polyethylene, an ethylene-vinyl acetate resin or an ethylene-ethyl acrylate resin.

20. A device comprising:
a substrate;
at least two active components formed on a top surface of the substrate;
at least one non-active region separating the active components;
a laminate comprising a plastic over the top surface of the substrate, encapsulating the at least two active components; and
at least one support post in the at least one non-active region, providing support for the laminate; wherein
the at least one support post includes a multi-layer architecture, having at least a first layer and a second layer, the first layer is adjacent to the active components and the second layer is adjacent to the laminate;
the first layer includes a dielectric material for isolating the active components;
the second layer includes a material that enhances sealing between the laminate and the first layer; and
the second layer includes one of a low-density polyethylene, an ethylene-vinyl acetate resin or an ethylene-ethyl acrylate resin.

21. A device comprising:
a substrate;
at least two active components formed on a top surface of the substrate;
at least one non-active region separating the active components;
a laminate comprising a plastic over the top surface of the substrate, encapsulating the at least two active components; and
at least one support post in the at least one non-active region, providing support for the laminate;
wherein the at least one support post includes a multi-layer architecture having at least a first layer and a second layer, the first layer adjacent to the active components and the second layer adjacent to the laminate, wherein the second layer contracts the plastic of the laminate and the first layer contacts the second layer.

22. A device comprising:
a substrate;
at least two active components formed on a top surface of the substrate;
at least one non-active region separating the active components;
a laminate comprising a plastic over the top surface of the substrate, encapsulating the at least two active components; and
at least one support post in the at least one non-active region, providing support for the laminate;
wherein the at least one support post includes a multi-layer architecture having at least a first layer and a second layer, the first layer is adjacent to the active components, the first layer contacts the second layer and the second layer is adjacent to the laminate, the first layer includes a dielectric material for isolating the active components and the second layer includes aluminum, tungsten, nickel, chromium, cobalt, silver, platinum, polyethylene, polypropylene or polystyrene.

23. A device comprising:
a substrate;
at least two active components formed on a top surface of the substrate;
at least one non-active region separating the active components;
a laminate comprising a plastic over the top surface of the substrate, encapsulating the at least two active components; and
at least one support post in the at least one non-active region, providing support for the laminate;
wherein the at least one support post includes a multi-layer architecture having at least a first layer and a second layer, the first layer is adjacent to the active opponents, the first layer contacts the second layer and the second layer is adjacent to the laminate, the first layer includes a dielectric material for isolating the active components, the second layer includes a material that enhances sealing between the laminate and the first layer, and the second layer includes aluminum, tungsten, nickel, chromium, cobalt, silver, platinum, polyethylene, polypropylene or polystyrene.

* * * * *

UNITED STATES PATENT AND TRADEMARK OFFICE
CERTIFICATE OF CORRECTION

| | | |
|---|---|---|
| PATENT NO. | : 7,262,441 B2 | Page 1 of 1 |
| APPLICATION NO. | : 11/171826 | |
| DATED | : August 28, 2007 | |
| INVENTOR(S) | : Ewald Karl Michael Guenther, Wei Wang and Soo Jin Chua | |

It is certified that error appears in the above-identified patent and that said Letters Patent is hereby corrected as shown below:

Column 8, Line 66 at Claim 23; replace:
"opponents, the first layer contacts the second layer and" with
-- components, the first layer contacts the second layer and --

Signed and Sealed this

Thirteenth Day of November, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,262,441 B2 | |
| APPLICATION NO. | : 11/171826 | |
| DATED | : August 28, 2007 | |
| INVENTOR(S) | : Ewald Karl Michael Guenther, Wei Wang and Soo Jin Chua | |

It is certified that error appears in the above-identified patent and that said Letters Patent is hereby corrected as shown below:

Column 6, Line 53 at Claim 1; replace:

"of the first laminate arid the first layer contacts the" with
--of the first laminate and the first layer contacts the--

Column 7, Line 6 at Claim 7; replace:

"The device of claim 6, wherein the directly patteniable" with
--The device of claim 6, wherein the directly patternable--

Column 7, Line 45 at Claim 19; replace:

"a laminate comprising a plastic over the top surface cf the" with
--a laminate comprising a plastic over the top surface of the--

Column 8, Line 29 at Claim 21; replace:

"nate, wherein the second layer contracts the plastic of" with
--nate, wherein the second layer contacts the plastic of--

Signed and Sealed this
Fourteenth Day of February, 2012

David J. Kappos
*Director of the United States Patent and Trademark Office*